United States Patent [19]
Stewart et al.

[11] Patent Number: 5,345,234
[45] Date of Patent: Sep. 6, 1994

[54] METHOD AND APPARATUS FOR COMBINING A FLASH ANALOG TO DIGITAL CONVERTER WITH DIGITAL TO ANALOG FUNCTIONS

[75] Inventors: Brett Stewart; Miki Moyal, both of Austin, Tex.

[73] Assignee: Advanced Micro Devices Inc., Sunnyvale, Calif.

[21] Appl. No.: 114,335

[22] Filed: Aug. 31, 1993

[51] Int. Cl.⁵ .................... H03M 1/02; H03M 1/36
[52] U.S. Cl. ................................. 341/108; 341/159
[58] Field of Search .............. 341/159, 108, 155, 144, 341/126

[56] References Cited

U.S. PATENT DOCUMENTS

| | | | |
|---|---|---|---|
| 4,160,243 | 7/1979 | Moriya et al. | 341/108 |
| 4,745,393 | 5/1988 | Tsukada et al. | 341/159 X |
| 4,752,766 | 6/1988 | Shimizu et al. | 341/159 |

Primary Examiner—Sharon D. Logan
Attorney, Agent, or Firm—Foley & Lardner

[57] ABSTRACT

A converter circuit provides analog to digital and digital to analog functions on a single silicon device. A flash analog to digital converter produces digital outputs using comparators which each receive an input signal and which each have different reference voltages. A decoder receiving digital inputs activates switches to connect selected ones of the same voltage references used by the flash analog to digital converter to a buffer which produces an analog output. The converter circuit can be a single or multi-stage flash analog to digital converter operating in a single channel or multi-channel environment. Timing and control logic prevents switching from occurring at times when perturbations on the voltage references could affect the analog and digital outputs.

20 Claims, 7 Drawing Sheets

METHOD AND APPARATUS FOR COMBINING A FLASH ANALOG TO DIGITAL CONVERTER WITH DIGITAL TO ANALOG FUNCTIONS

BACKGROUND OF THE INVENTION

1. Field of the Invention

The invention deals generally with analog to digital data conversion and, in particular, with a method and apparatus for combining a flash analog to digital converter with digital to analog functions.

2. Related Art

Systems which process signals using digital signal processing techniques require that analog signals be converted to digital form. Such conversions have been accomplished using analog to digital converters. Techniques employed in analog to digital converters have included successive approximation and subranging techniques. Time delays inherent in apparatus implementing such techniques have given rise to the development of the flash analog to digital converter.

Figure 1:
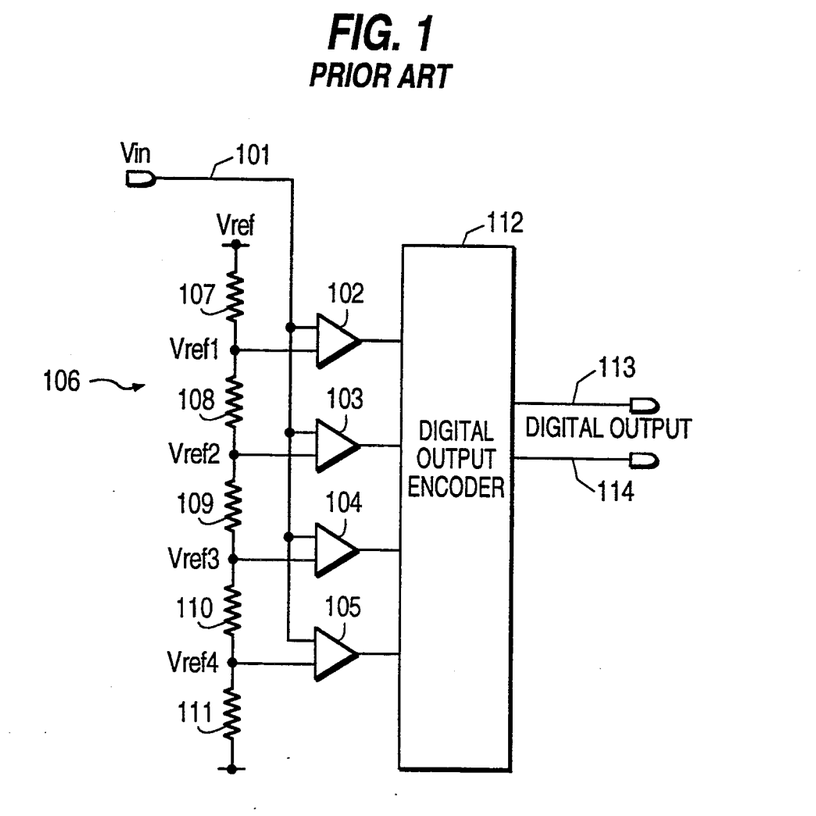
FIG. 1 shows a flash analog to digital converter of the prior art.

A diagram of a relatively simple 2-bit flash analog to digital converter is shown in FIG. 1. An analog input signal, which is to be converted to digital form, is applied at Vin and transmitted over input channel 101 to a first input of comparators 102–105. A voltage reference Vref is applied across a voltage divider network 106, shown in FIG. 1 as having resistors 107–111. Voltages Vref1–Vref4 are developed at the junctions of the resistors and are applied to second inputs of comparators 102–105. The output of each comparator is a logical 1 or logical 0 depending on whether the voltage applied at the first input exceeds the reference voltage applied to that comparator. The logical ones and zeros output by comparators 102–105 are then applied to a digital output encoder 112 to produce a 2-bit digital output on signal lines 113 and 114.

As illustrated in FIG. 1, a 2-bit flash analog to digital converter has five resistors in the voltage divider network 106. A flash analog to digital converter of necessity uses a large resistive voltage divider to generate multiple reference voltages to compare against the input during the conversion process. As the number of output bits increases, the number of resistors in the voltage divider also increases. Typically, the resistive voltage divider is the largest and hence, most expensive silicon structure of the converter.

Digital to analog converters have been implemented with resistive divider networks and switches which switch in various points on a ladder network in response to digital codes. Thus resistive voltage dividers find use in both analog to digital and digital to analog converters.

Systems requiring both analog to digital and digital to analog conversion simultaneously, often use separate devices for such conversions. Such separate devices contribute to systems costs and may introduce performance compromises as a result of variations in the corresponding performance of the analog to digital converter and the digital to analog converter. In particular, voltage references used in the converters may be slightly different due to variations in the components of the separate devices, thereby introducing errors between respective digital to analog and analog to digital conversions.

SUMMARY OF THE INVENTION

In view of the above characteristics and limitations of the related art, it is an object of the invention to provide a method and apparatus in which analog to digital and digital to analog conversion can be performed simultaneously in an economical manner.

It is another object of the invention to provide an analog to digital and digital to analog converter which is more accurate than those of conventional design.

It is still another object of the invention to combine analog to digital and digital to analog conversion functions on a single silicon structure.

It is a still further object of the invention to improve the accuracy of analog to digital and digital to analog converter systems by re-using in digital to analog conversion the same references provided for analog to digital conversion by the large voltage divider available in an analog to digital converter.

It is a still further object of the invention to derive input and output conversion references from a common voltage divider, thereby improving conversion and system accuracy.

The above and other objects of the invention are achieved by a converter circuit including a plurality of comparators and an analog input channel, which receives an analog signal to be converted and routes the signal to first inputs of the comparators. A voltage divider network provides a plurality of different voltage references to second inputs of the comparators. The outputs of the comparators form a digital representation of an amplitude of the analog signal. The converter circuit also includes a plurality of switches. Each of the switches is connected between one of the second inputs of the comparators and an analog output, which provides an analog representation of digital inputs to the system. A switch controller controls each of the switches. Under control of the switch controller, each switch is operated to connect one of the second inputs of the second comparators to the analog output in accordance with the status of the digital inputs.

Each of the switches has a first terminal connected to the analog output, a second terminal connected to the second terminal of a comparator, and a control input which controls connection of the first and second terminals of the switch to each other. The voltage divider circuit is typically a resistor ladder having a first resistor connected to the voltage reference and other resistors connected in series with the first resistor. A timing control system can be used to control the switching so that the switches change state at time periods when disturbances on the voltage references have essentially no effect on the analog and digital outputs.

A converter according to the invention can employ a flash analog to digital converter which operates either as a single stage or a multi-stage flash analog to digital converter. The multi-stage analog to digital converter includes one or more additional pluralities of comparators, which are switched to operate at voltage references intermediate voltage references in the first plurality of comparators. This configuration provides additional precision and provides pipelining of data conversion by allowing the second group of comparators to develop higher precision digital outputs while the first group of comparators moves on to perform another conversion. This facilitates the converter's ability to handle requests for data conversion coming at high request rates from one or more sources.

A converter according to the invention can also operate as a single stage or multi-stage converter with single or multiple channel inputs. A converter according to the invention can be operated with a timing and multiplexing control system in which predetermined time constraints are programmed to provide switching between channels and stages and between analog to digital and digital to analog conversion at times when perturbations on the voltage references will not affect the analog or digital outputs.

BRIEF DESCRIPTION OF THE DRAWINGS

A system according to the invention is described herein with particularity with reference to the drawings in which.

DETAILED DESCRIPTION OF THE PREFERRED EMBODIMENTS

As previously discussed, a simple flash analog to digital converter, such as that shown in FIG. 1, employs a resistive voltage divider network to generate voltage references which serve as one input to each of several comparators, whose other inputs are the input voltage to be converted. A block of logic, for example, digital output encoder 112, performs the 4-bit to 2-bit encoding function to produce an appropriate digital output.

Figure 2:
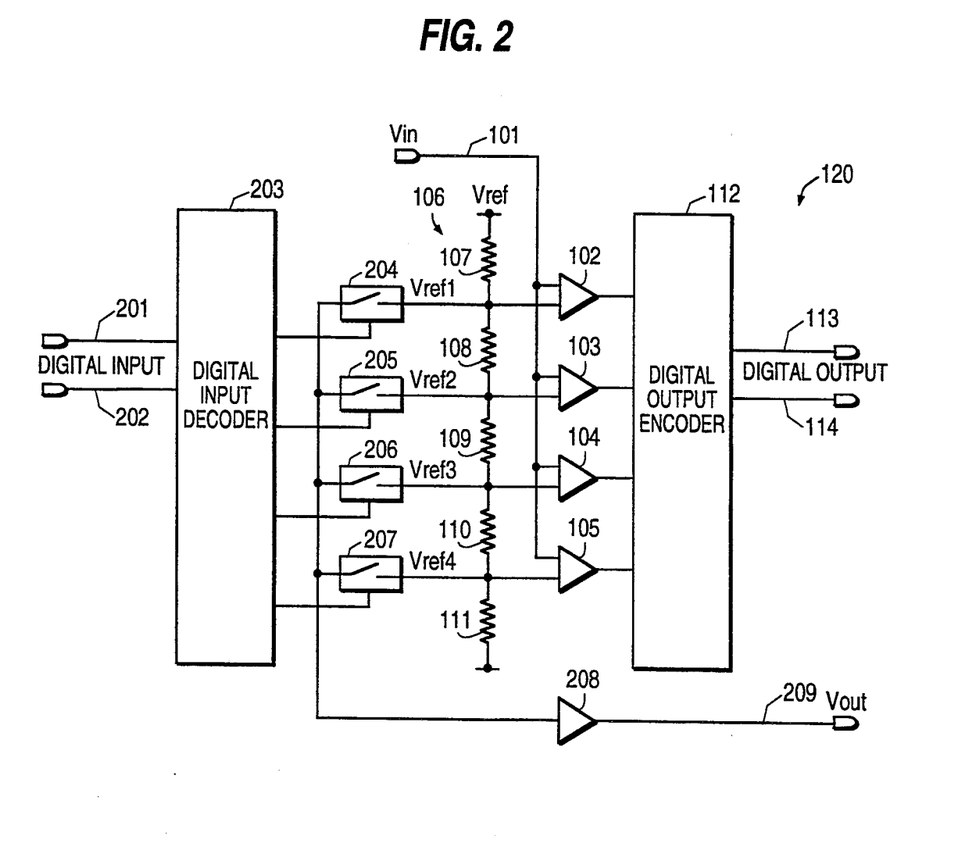
FIG. 2 illustrates a 2-bit converter circuit according to the invention.

A converter system according to the invention reuses the available voltage taps of the resistive divider in the analog to digital converter as reference levels for outputs. FIG. 2 illustrates a simplified example of a combination 2-bit digital to analog converter sharing references with the 2-bit analog to digital converter shown in FIG. 1.

A converter circuit according to the invention, shown generally at 120, receives an analog input Vin which is applied on input channel 101 to comparators 102–105. As discussed with respect to FIG. 1, voltage divider network 106, including resistors 107–111, provides voltage references to comparators 102–105. The outputs of the comparators are then encoded by encoder 112 to produce digital outputs 113 and 114.

According to the invention, digital inputs are applied, for example, on digital signal lines 201 and 202 to digital input decoder 203. Digital input decoder 203 converts the 2-bit digital input into 4 bits which are used to control switches 204–207. For example, logical ones on signal lines 201 and 202 simultaneously would be decoded into logical states such that all four switches 204–207 were closed, thereby applying the maximum possible current to buffer amplifier 208, which would be used to produce Vout on signal line 209. Similarly, logical zeros appearing simultaneously on signal lines 201 and 202 would be decoded such that all four switches 204–207 would be open, thereby producing no current to amplifier 208 and 0 volts at Vout on signal line 209. A logical 0 and a logical 1 applied on either of signal lines 201 and 202 would be decoded such that different ones of switches 204–207 would be closed, thereby generating various levels of current to amplifier 208 and various intermediate output voltages on signal line 209. It will be known that the decoding scheme is arbitrary and has been described herein by way of example and not limitation, as any decoding scheme can be implemented to actuate switches 204–207.

As shown in FIG. 2, a digital 2-bit to 1-of-4 decoder 203 is used to select which reference voltage already available on voltage divider 106 will be presented to buffer 208 for output. Typically, the resistive divider is the largest single structure of the flash converter. Using the same divider to provide references for output Vout as for the analog to digital conversion, economizes on silicon area. The converter according to the invention has the additional benefit of improving accuracy by using the same reference voltages for analog to digital and digital to analog input and output conversions. It will be known to those of ordinary skill that the 2-bit example illustrated in FIG. 2 is a simplified example which can be expanded to N-bits as needed.

In the theoretical situation, where the comparators, for example, 102–105, and the buffer, for example, 208, each have infinite impedance, and where the values of the resistive divider elements can be arbitrarily chosen, the operation of the analog to digital and digital to analog functions can proceed concurrently without affecting each other. In practical systems, the operation of one section can disturb the operation of the other.

For example, assume the digital to analog output buffer 208 has a large but not infinite impedance. As numerical values are presented to decoder 203, various switches 204–207 selecting the reference voltage for output will open and close. Each time the switches open and close, the value of the reference voltages everywhere on the divider 106 can be disturbed.

To allow concurrent operation of the analog to digital and digital to analog functions, some provision must be made to prevent such perturbations or similar disturbances in the values on the voltage reference tree 106 to propagate between the systems. One means for performing this function is to enforce timing constraints on when switches can open and close. For example, if the analog to digital converter portion shown by reference designators 101–114 of the converter circuit 120 is about to be latched for a sample, it would be useful to prevent switches 204–207 from opening or closing at the same time. Allowing switches 204–207 to open or close simultaneously with latching a sample for analog to digital conversion could result in the references jittering up or down, thereby introducing the possibility of erroneous analog to digital conversion.

Figure 3:
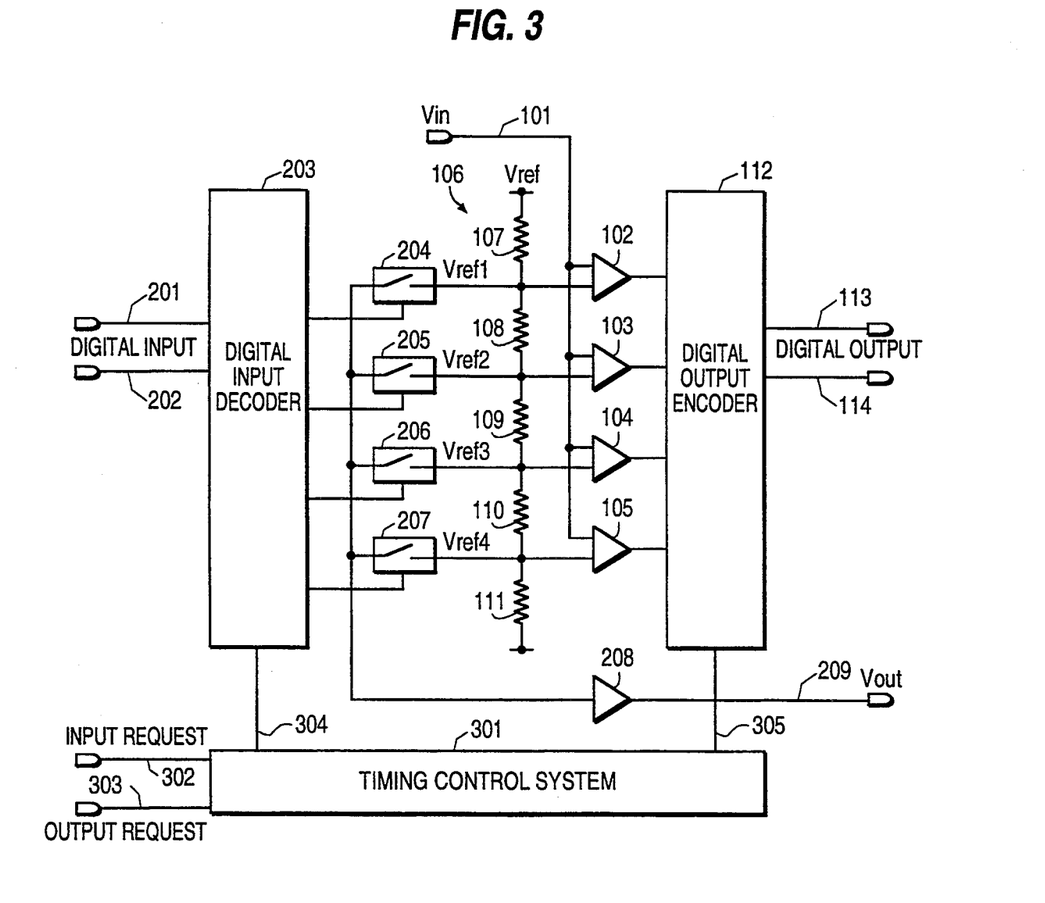
FIG. 3 illustrates a 2-bit converter circuit according to the invention including a timing control system.

FIG. 3 illustrates a timing control system 301 which responds to input requests on signal line 302 and output requests on signal line 303. In response to such input and output requests, timing control system 301 provides signals 304 and 305 to digital input decoder 203 and digital output encoder 112, respectively. Timing control system 301 constrains disturbance of the voltage reference divider 106 to occur only during those times when such disturbances will not affect correct operation of the system.

As will be known to those of ordinary skill, timing control system 301 can be constructed using logic devices, processor devices, or programmed devices, such as memories. Timing control system 301 can be configured to inhibit switching of switches 204–207 in response to an input request on signal line 302, or an output request on signal line 303. This is accomplished by transmitting an inhibit signal from timing control system 301 to digital input decoder 203 on signal line 304. Similarly, timing control system 301 can produce an inhibit signal on signal line 305 to prevent digital output encoder 112 from changing state during times when switches 204–207 are changing state. It will be known to those of ordinary skill that timing control system 301 can be implemented to provide enable signals on signal lines 304, 305 as well as inhibit signals. While timing control system 301 is typically event driven by input and output requests on signal lines 302 and 303, timing control system 301 may also be configured such that inhibit and/or enable signals on signal lines 304 and 305 are generated at particular times relative to a clock. The specific configuration of the timing control system 301 will depend on the timing constraints, processing capability and logic family implementation of the system.

A practical system can be implemented as a 1/n conversion architecture, rather than as the full flash systems shown in FIGS. 1–3. One reason for implementing 1/n flash conversion systems is that as the number of bits of accuracy required increases to higher n, $2^n$ comparators are required. The number of comparators then begins to dominate the area of silicon chip and increases the power consumption necessary for the system to operate. A multi-stage 1/n flash conversion system, may include multiplexing and high speed pipelining functions. Multi-stage analog to digital conversion has the effect of adding other potential sources of disturbances to the value of the references. For example, in a ½ flash system of 8-bits output accuracy, implemented as 2 4-bit flashes with 16 comparators for each 4-bits of precision, each sample may imply that the second ½ stage of comparators would be switched to a different set of references at a higher or lower location on the divider. The switching operation of the second ½ flash stage would disturb values of the reference tree and impose a different set of timing constraints on the timing control circuit in FIG. 3.

Figure 4:
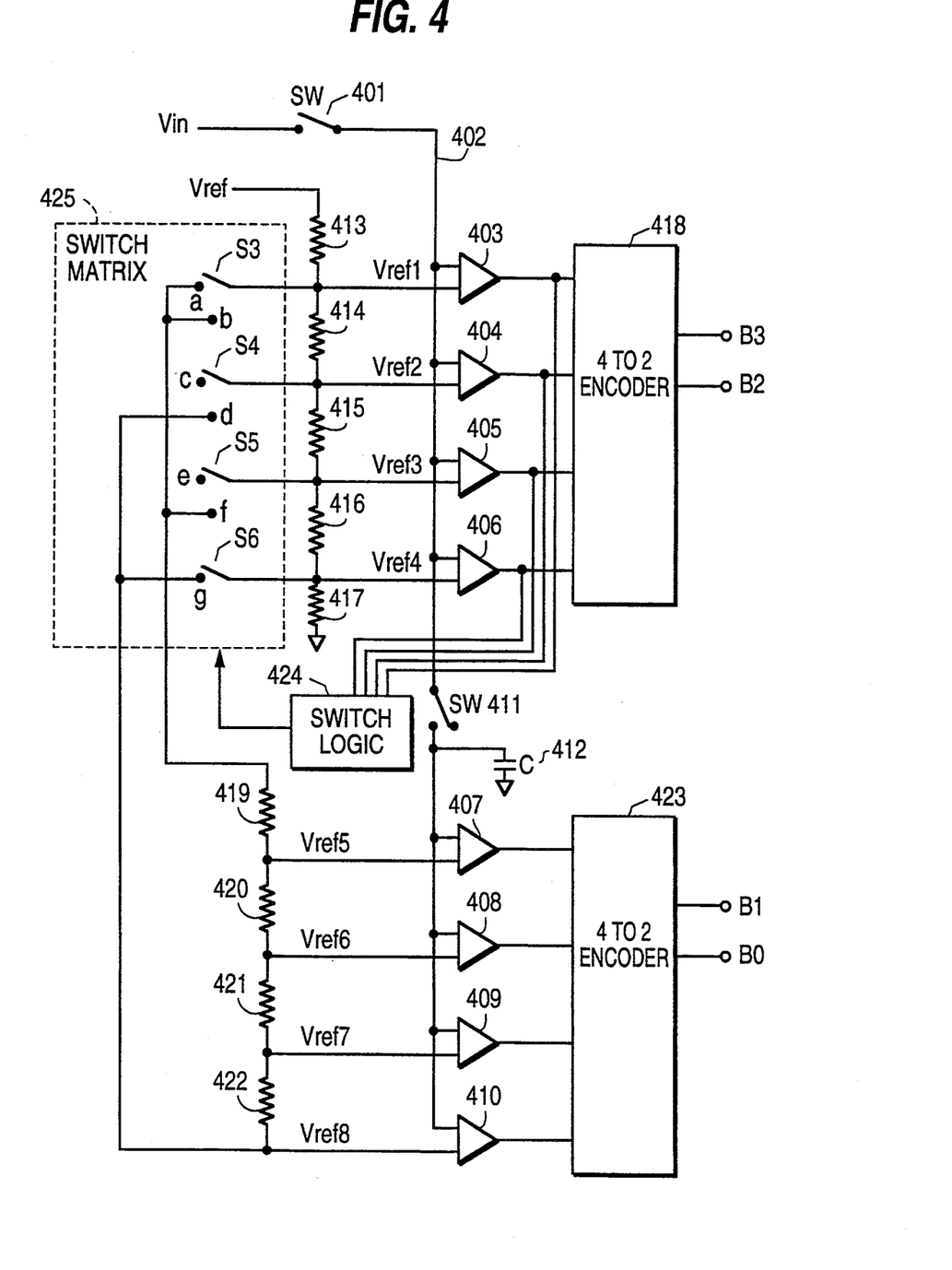
FIG. 4 illustrates a single channel, multi-stage analog to digital converter.

FIG. 4 is a simplified diagram of a ½ flash system of 4-bits output accuracy implemented as two 2-bit flashes with 4 comparators for each 2-bits of precision. A first ½ stage includes comparators 403–406, resistors 413–417, and encoder 418. A second ½ flash stage includes comparators 407–410, resistors 419–422 and encoder 423. In operation, when switches 401 and 411 are closed, an input signal to be converted is provided on input channel 402 to each of the comparators 403–410. The first half flash stage produces logical zeros and ones at the outputs of comparators 403–406. When capacitor 412 is fully charged, switch 411 can be opened. Based on the output of comparators 403–406, switch logic 424 operates to open and close appropriate switches S3–S6 in switch matrix 425. It will be known to those of ordinary skill that switch logic 424 can be implemented within switch matrix 425, although it is shown herein as a separate element in FIG. 4 by way of illustration, and not limitation. At this point, outputs B2 and B3 from encoder 418 can be provided to a first in, first out memory to be provided to a system in a pipeline fashion with outputs B1 and B0, which will be generated by the second half flash stage.

Switching of switch matrix 425 results in the application of a voltage across the network formed by resistors 419–422. This applies voltage references Vref5 through Vref8 to comparators 407–410. The outputs of these comparators are then routed to encoder 423 to provide outputs B1 and B0. These comparator outputs are then also routed to a first-in, first-out memory, not shown, for pipelining to the rest of the system. It will be known to those of ordinary skill that outputs B0–B3 can also be stored and provided in a parallel fashion or transmitted in any other known way for use by the rest of the system.

As illustrated in FIG. 4, voltage references Vref 5–Vref 8 will be between Vref 1 and Vref 2 when switch S3 is in position a, S4 is in position d, and S5 is in position e and S6 is open. Similarly, voltages Vref 5–Vref 8 will be between Vref 2 and Vref 3 when switch S3 is open, switch S4 is in position b, switch S5 is in position d, and switch S6 is open. Voltage references Vref 5–Vref 8 will be between Vref 3 and Vref 4 when switch S3 is open, switch S4 is in position c, switch S5 is in position f, and switch S6 is in position g. The positioning of switches S3–S6 is a function of the outputs of comparators 403–406 as determined by switch logic 424. It will also be known to those of ordinary skill that switch matrix 425 can be implemented in any known fashion to apply appropriate voltages at higher or lower levels at a higher or lower location on the divider formed by resistors 413–417 and voltage reference Vref. It will be known to those of ordinary skill that any number of stages for a 1/n flash conversion system can also be formed.

Figure 5:
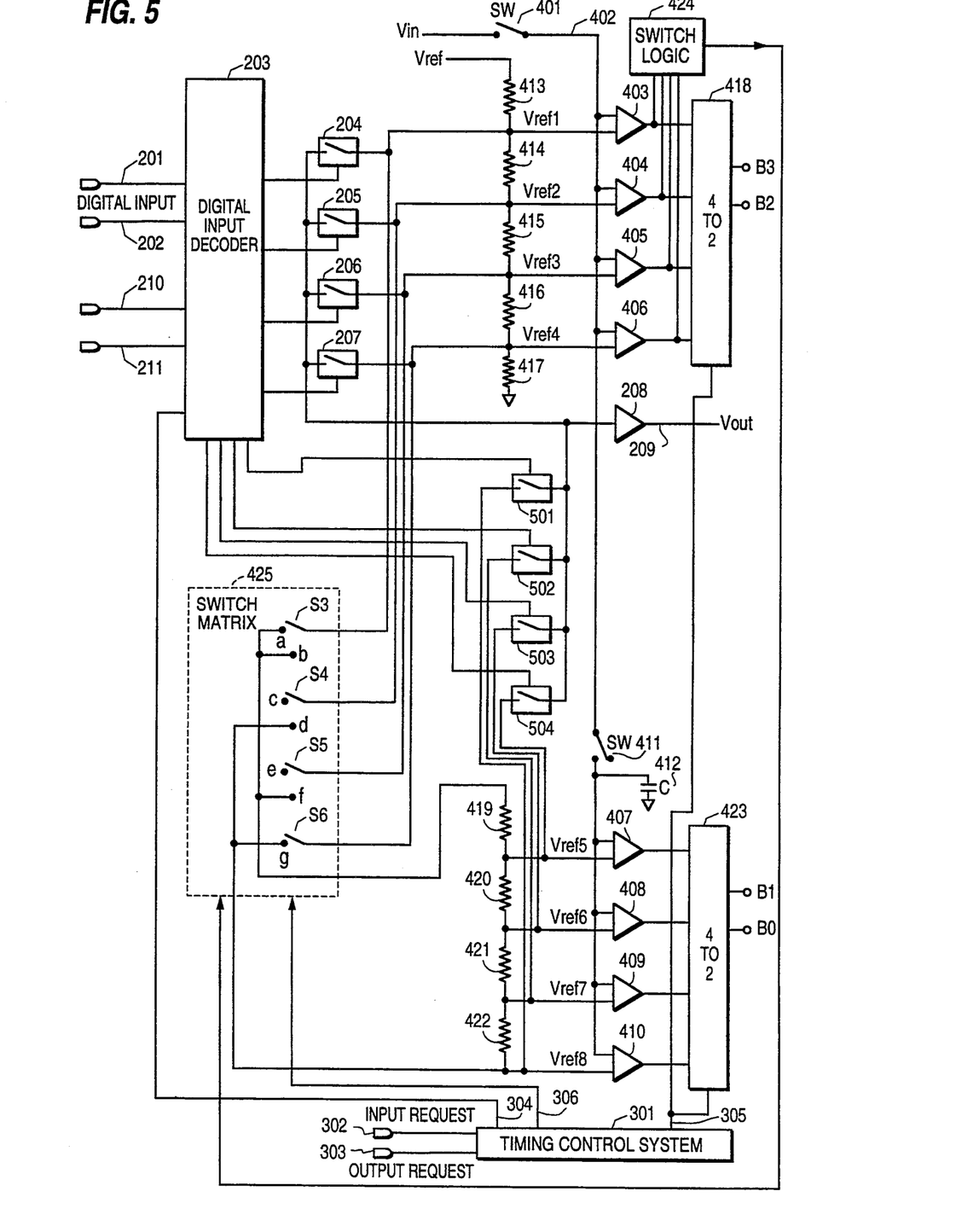
FIG. 5 illustrates a single channel multi-stage combined analog to digital and digital to analog converter circuit.

As previously discussed, switching operation of the second ½ flash stage would disturb values in the reference trees, thereby imposing different timing constraints. An example of a ½ flash conversion system according to the invention is shown in FIG. 5. In addition to the elements of the multi-stage converter previously shown in FIG. 4, FIG. 5 shows the incorporation of the digital to analog function with digital input decoder 203 responsive to digital inputs 201–202 and 210–211. Digital inputs 201–202 control switching of switches 204–207, while inputs 210–211 control switching of elements 501–504, which are used to provide the higher precision available in the second half flash stage. Timing control system 301 is again responsive to input requests on signal line 302 and output requests on signal line 303 to provide enable and inhibit signals on signal lines 304 and 305, as previously discussed. In addition, on signal line 306, timing control system 301 provides enable and inhibit signals to switch matrix 425 to prevent switch matrix 425 from being switched at times when perturbations on voltage references Vref 1 through Vref 8 could produce errors in the output of the converter. Thus, timing control system 301 operates to control digital input decoder 203, output decoders 418, 423 and switch matrix 425 such that switching of these devices does not occur during input or output requests on signal lines 302, 303.

Figure 6:
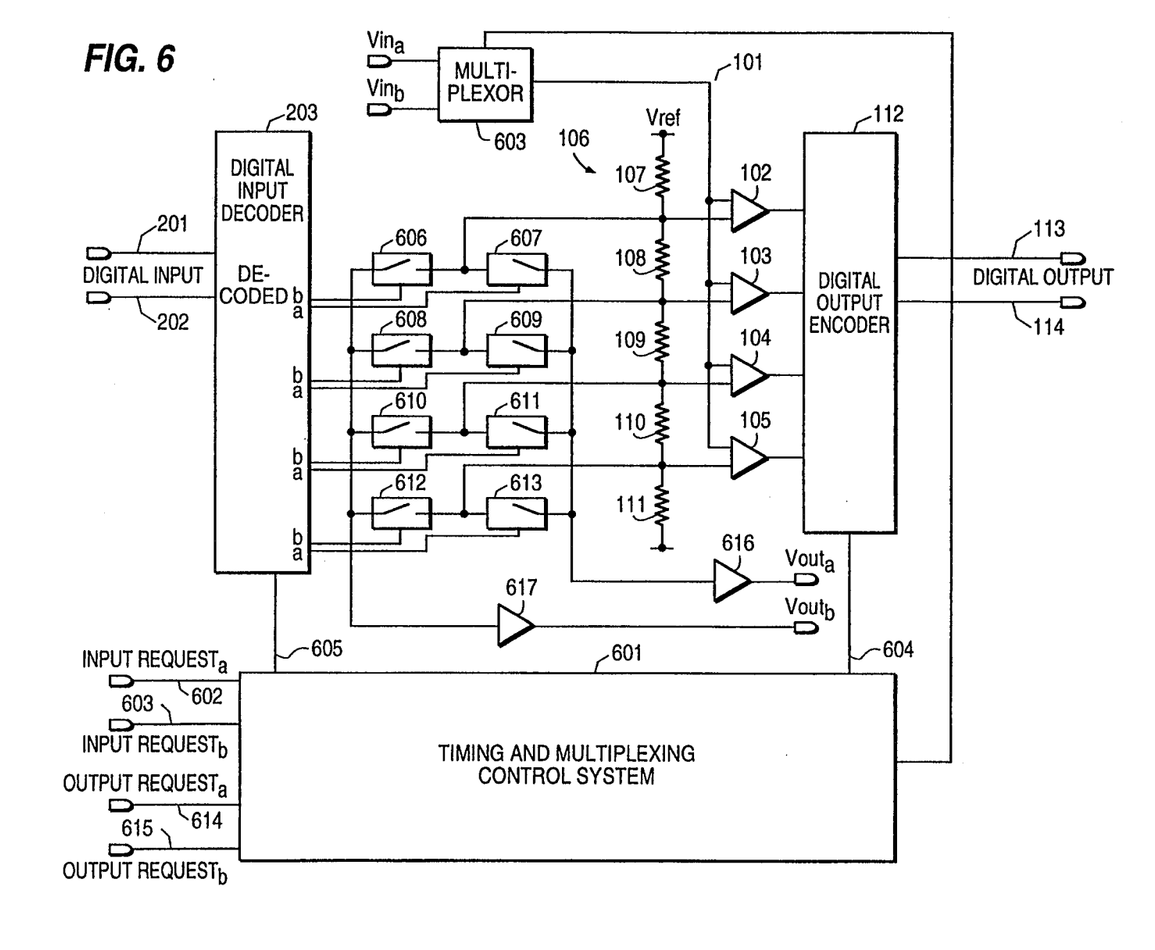
FIG. 6 illustrates a multi-channel combined analog to digital and digital to analog converter circuit.

An analog to digital converter with digital to analog functions according to the invention can also be implemented in systems with multiple input and multiple output channels. This adds new constraints to the timing control circuit. FIG. 6 illustrates the 2-input 2-output case with 2-bits of accuracy and a single stage analog to digital converter with digital to analog functions.

In this system, the timing and multiplex control system 601 has the function of steering decoded inputs to the correct set of switches for the channel being output, selecting the correct multiplexer operation so that the desired input channel is converted by the flash analog to digital converter, and assuring that the operation of the various components of the system that might disturb the values of the voltage references generated by the divider are never allowed to occur simultaneously.

In response to an input request on signal line 602 and signal line 603, timing and multiplexing control system 601 activates multiplexer 604 to select either $Vin_a$ or $Vin_b$. The selected input is provided on analog input channel 101 to comparators 102–105 as previously described. Also as previous described, voltages developed by the voltage divider 106 through resistors 107–111 are applied to the opposite sides of comparators 102–105 to generate a plurality of logical ones and zeros. These logical ones and zeros are encoded by digital output encoder 112 to produce digital outputs on signal lines 113 and 114. Perturbations which occur on the voltage references during this conversion could introduce errors at the digital output. Thus timing and multiplexing control system 601 generates an inhibit signal on signal line 605, which prevents switches 606–613 from being activated while such a conversion takes place.

When an output request is received on signal lines 614 or 615, timing and multiplexing control system 601 sends a signal on signal lines 605 to digital input decoder 203 to cause appropriate switches among switches 606–613 to be activated. For example, if a signal is received on output request line 615, timing and multiplex control system 601 activates digital input decoder 203 to open and close switches 606, 608, 610 and 612 in response to digital inputs 201 and 202. Similarly, if an output request is received on signal line 614, timing and multiplexing control system 601 activates digital input decoder 203 to open and close switches 607, 609, 611 and 613 in response to digital inputs 201, 202. The result of this switching provides inputs to buffer amplifiers 616 and 617 to produce channelized outputs $Vout_a$ and $Vout_b$.

It should be noted that requests by the various channels can be event generated in an asynchronous fashion or can be scheduled, as for example in a polling circuit.

Figure 7:
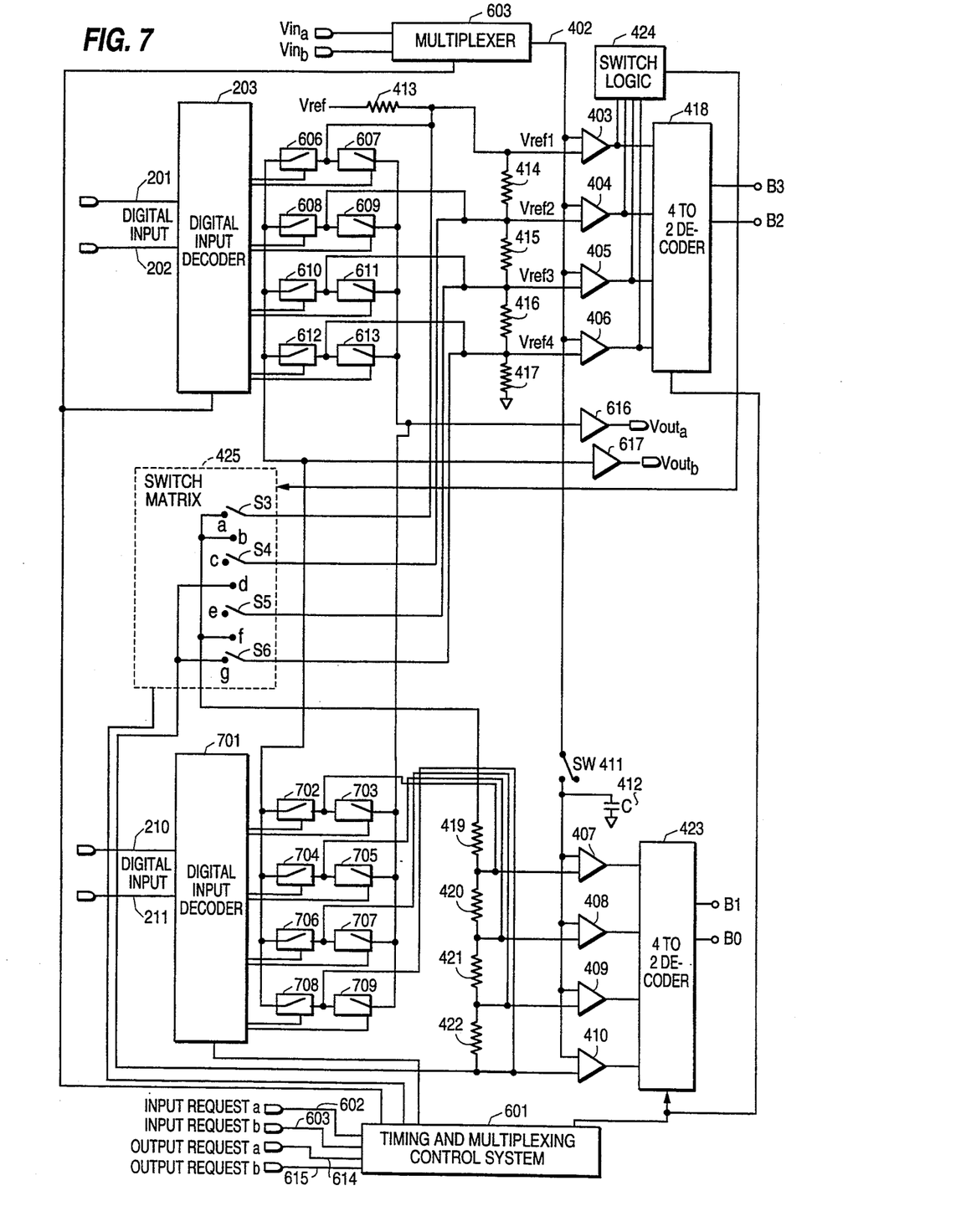
FIG. 7 illustrates a multi-channel, multi-stage combined analog to digital and digital to analog converter circuit.

FIG. 7 illustrates a multi-stage, multi-channel analog to digital converter with digital to analog function according to the invention. FIG. 7 shows a ½ stage flash converter with two channel capability. This converter operates on the same principles as those discussed above for the multi-stage analog to digital converter with digital to analog functions, shown in FIG. 5, and the multi-channel analog to digital converter with digital to analog functions, shown in FIG. 6. FIG. 7 illustrates digital input decoder 701 responsive to digital inputs 210 and 211 to control switches 702–709. It will be known to those of ordinary skill that the digital input decoder 701 could be implemented in the same circuitry as digital input decoder 203.

There is no intrinsic limit to the number of simultaneous channels of input or output to be operated other than the ability to choose timings and parametric values such that disturbances to the divider have no significance. It should further be noted that there is no intrinsic constraint that the input or output channels have the same number of bits of precision or even the same coding. A system according to the invention performs highly complex conversion operations on multiple input or output channels. However, the analog content of the system is minimal. If fabrication processes and a system such as that according to the invention change, only a single comparator cell and a single buffer cell would require significant redesign. Most of the functions to achieve system operation are logic functions which a new process typically accommodates easily. Thus, the converter according to the invention not only provides new and unique functions, it also is easily adapted to the requirements of new and changing systems.

While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A converter circuit comprising:
   a plurality of comparators;
   an analog input channel for receiving an analog signal and routing said analog signal to first inputs of said comparators;
   a voltage divider network providing a plurality of different voltage references to second inputs of said comparators, outputs of said comparators thereby forming a digital representation of an amplitude of said analog signal;
   a plurality of switches, each of said switches being connected between one of said second inputs of said comparators and an analog output, said analog output providing an analog representation of digital inputs;
   a switch controller controlling each of said switches to connect said one of said second inputs of said comparators to said analog output in response to a logic condition of said digital inputs.

2. The apparatus recited in claim 1, wherein each of said switches comprises a first terminal connected to said analog output, a second terminal connected to a said second terminal of a said comparator, and a control input controlling connection of said first and second terminals of said switch to each other.

3. The apparatus recited in claim 2, further comprising a buffer circuit between said analog output and an output terminal.

4. The apparatus recited in claim 1, wherein said voltage divider comprises a resistor ladder having a first resistor connected to a voltage reference and at least one resistor connected in series with said first resistor.

5. The apparatus recited in claim 1, further comprising a timing control system, said timing control system controlling switching of said switches.

6. The apparatus recited in claim 5, wherein said timing control system comprises means for controlling said switches to change state during time periods when disturbances to voltage references on said second inputs of said comparators have essentially no effect on said analog and digital outputs.

7. The apparatus recited in claim 5, comprising a digital decoder connected between said digital inputs and said comparators.

8. The apparatus recited in claim 5, comprising an encoder connected between said outputs of said comparators and digital output terminals.

9. The apparatus recited in claim 5, wherein said converter circuit comprises a flash analog and digital converter.

10. The apparatus recited in claim 9, wherein said converter circuit is a multi-stage flash analog to digital converter.

11. The apparatus recited in claim 10, wherein said timing control system further comprises means for controlling said switches to change state during time periods when said voltage references on said second inputs of said comparators as a result of switching between stages have essentially no effect on said analog and digital outputs.

12. The apparatus recited in claim 9, wherein said converter circuit comprises a multiple input channel flash analog to digital converter.

13. The apparatus recited in claim 12, wherein said plurality of switches comprises:
   a first plurality of switches, each of said first plurality of switches being connected between said one of said second inputs of said comparators and a first channel analog output; and
   at least one additional plurality of switches, each of said additional plurality of switches being connected between said one of said second inputs of said comparators and an analog output for an additional channel.

14. The apparatus recited in claim 13, wherein said timing system comprises a multiplexer for steering decoded said digital inputs to one of said first and additional plurality of switches, such that a desired one of said multiple channels is converted by said converter.

15. The apparatus recited in claim 14, comprising a channel selector for selecting said desired channel.

16. The apparatus recited in claim 14, comprising a polling circuit for selecting a sequence of said channels in a predetermined order.

17. The apparatus recited in claim 12, wherein said converter circuit further comprises a multi-stage flash analog to digital converter.

18. The apparatus recited in claim 17, wherein said timing control system further comprises means for controlling said first and additional plurality of switches to change state during time periods when said voltage reference in said second inputs of said comparators as a result of switching between stages have essentially no effect on said analog and digital outputs.

19. The apparatus recited in claim 10, wherein said multi-stage analog to digital converter comprises a second plurality of comparators receiving said analog signal on first inputs of said second plurality of comparators and switches for routing reference voltage levels intermediate of said different voltage references to second inputs of said second plurality of comparators.

20. The apparatus recited in claim 17, wherein said multi-stage analog to digital converter comprises a second plurality of comparators receiving said analog signal on first inputs of said second plurality of comparators and switches for routing reference voltage levels intermediate of said different voltage references to second inputs of said second plurality of comparators.

* * * * *